US009245749B2

(12) United States Patent
Sasaki et al.

(10) Patent No.: US 9,245,749 B2
(45) Date of Patent: Jan. 26, 2016

(54) METHOD OF FORMING GA2O3-BASED CRYSTAL FILM AND CRYSTAL MULTILAYER STRUCTURE

(71) Applicants: TAMURA CORPORATION, Tokyo (JP); National Institute of Information and Communications Technology, Tokyo (JP)

(72) Inventors: Kohei Sasaki, Tokyo (JP); Masataka Higashiwaki, Tokyo (JP)

(73) Assignees: TAMURA CORPORATION, Tokyo (JP); NATIONAL INSTITUTE OF INFORMATION AND COMMUNICATIONS TECHNOLOGY, Tokyo (JP)

(*) Notice: Subject to any disclaimer, the term of this patent is extended or adjusted under 35 U.S.C. 154(b) by 0 days.

(21) Appl. No.: 14/581,893

(22) Filed: Dec. 23, 2014

(65) Prior Publication Data

US 2015/0179445 A1 Jun. 25, 2015

(30) Foreign Application Priority Data

Dec. 24, 2013 (JP) .................................. 2013-265771

(51) Int. Cl.
*H01L 29/06* (2006.01)
*H01L 21/02* (2006.01)
(Continued)

(52) U.S. Cl.
CPC ........ *H01L 21/02565* (2013.01); *C30B 23/025* (2013.01); *C30B 25/186* (2013.01);
(Continued)

(58) Field of Classification Search
CPC ............ H01L 29/045; H01L 21/02609; H01L 21/02565; H01L 21/02636
USPC ................................ 257/13, 43; 438/47, 104
See application file for complete search history.

(56) References Cited

U.S. PATENT DOCUMENTS 8,143,140 B2* 3/2012 Kasai et al. .................... 438/458
2011/0212560 A1* 9/2011 Sumitomo et al. ............... 438/47
(Continued)

FOREIGN PATENT DOCUMENTS

EP 1 598 450 A2 11/2005
JP 2008-303119 A 12/2008
(Continued)

OTHER PUBLICATIONS

Extended European Search Report dated Feb. 16, 2015.
(Continued)

*Primary Examiner* — Jami M Valentine
(74) *Attorney, Agent, or Firm* — McGinn IP Law Group, PLLC

(57) ABSTRACT

A method of forming a $Ga_2O_3$-based crystal film includes epitaxially growing a $Ga_2O_3$-based crystal film on a (001)-oriented principal surface of a $Ga_2O_3$-based substrate at a growth temperature of not less than 750° C. A crystal multilayer structure includes a $Ga_2O_3$-based substrate with a (001)-oriented principal surface, and a $Ga_2O_3$-based crystal film formed on the principal surface of the $Ga_2O_3$-based substrate by epitaxial growth. The principal surface has a flatness of not more than 1 nm in an RMS value.

4 Claims, 10 Drawing Sheets

(51) Int. Cl.
    *H01L 29/24*     (2006.01)
    *C30B 23/02*     (2006.01)
    *C30B 25/18*     (2006.01)
    *C30B 25/20*     (2006.01)
    *C30B 29/16*     (2006.01)
    *H01L 29/78*     (2006.01)
    *H01L 29/778*     (2006.01)
    *H01L 29/812*     (2006.01)
    *H01L 29/872*     (2006.01)

(52) U.S. Cl.
    CPC ............... *C30B 25/20* (2013.01); *C30B 29/16* (2013.01); *H01L 21/02414* (2013.01); *H01L 21/02433* (2013.01); *H01L 21/02587* (2013.01); *H01L 29/24* (2013.01); *H01L 29/7787* (2013.01); *H01L 29/7838* (2013.01); *H01L 29/812* (2013.01); *H01L 29/872* (2013.01); *H01L 21/02631* (2013.01)

(56) References Cited

U.S. PATENT DOCUMENTS

2013/0207076 A1* 8/2013 Yoshimoto et al. ............ 257/13
2014/0217554 A1* 8/2014 Sasaki .......................... 257/616

FOREIGN PATENT DOCUMENTS

| JP | 2009-091212 A | 4/2009 |
| JP | 2013-056802 A | 3/2013 |
| WO | WO 2013/035464 A1 | 3/2013 |

OTHER PUBLICATIONS

Oshima T et al.: "Surface Morphology of Homoepitaxial beta-$Ga_2O_3$ Thin Films Grown by Molecular Beam Epitaxy", Thin Solid Films, Elsevier-Sequoia S.A. Lausanne, CH, vol. 516, No. 17, Jul. 1, 2008, pp. 5768-5771, XP022688390.

Kohei Sasaki, et al.: "MBE Grown $Ga_2O_3$ and Its Power Device Applications", Journal of Crystal Growth, vol. 378, Sep. 1, 2013, pp. 591-595, XP055168133.

Japanese Office Action dated Apr. 7, 2015 with a partial English translation thereof.

* cited by examiner

METHOD OF FORMING GA2O3-BASED CRYSTAL FILM AND CRYSTAL MULTILAYER STRUCTURE

The present application is based on Japanese patent application No. 2013-265771 filed on Dec. 24, 2013, the entire contents of which are incorporated herein by reference.

BACKGROUND OF THE INVENTION

1. Field of the Invention

The invention relates to a method of forming a $Ga_2O_3$-based crystal film, and a crystal multilayer structure including the $Ga_2O_3$-based crystal film.

2. Description of the Related Art

A technique is known in which a $Ga_2O_3$-based crystal film is epitaxially grown on a $Ga_2O_3$-based substrate (see e.g. WO 2013/035464).

Referring to WO 2013/035464, when the $Ga_2O_3$-based crystal film is grown on the $Ga_2O_3$-based substrate with a (001)-oriented principal surface at a growth temperature of 700° C., the growth rate of the $Ga_2O_3$-based crystal film is about 90 nm/h. Likewise, when the $Ga_2O_3$-based crystal film is grown on the $Ga_2O_3$-based substrate with a (010)-oriented principal surface at a growth temperature of 700° C., the growth rate of the $Ga_2O_3$-based crystal film is about 130 nm/h.

SUMMARY OF THE INVENTION

The growth rate of the $Ga_2O_3$-based crystal film needs to be higher, e.g., about 0.1 μm/h at the minimum, in terms of the mass productivity of the $Ga_2O_3$-based crystal film. However, even if the growth rate is sufficiently increased, the $Ga_2O_3$-based crystal film with a poor crystalline quality or insufficient surface flatness may not be practically used.

It is an object of the invention to provide a method of forming a $Ga_2O_3$-based crystal film that allows a $Ga_2O_3$-based crystal film with an excellent crystal quality and surface flatness to be formed at a high growth rate suitable for the mass productivity, as well as a crystal multilayer structure including the $Ga_2O_3$-based crystal film formed by the method.

According to one embodiment of the invention, a method of forming a Ga2O3-based crystal film as defined in [1] to [3] below is provided.

[1] A method of forming a $Ga_2O_3$-based crystal film, comprising epitaxially growing a $Ga_2O_3$-based crystal film on a (001)-oriented principal surface of a $Ga_2O_3$-based substrate at a growth temperature of not less than 750° C.

[2] The method according to [1], wherein the principal surface of the $Ga_2O_3$-based crystal film has a flatness of not more than 1 nm in an RMS value.

[3] The method according to [1] or [2], wherein the $Ga_2O_3$-based crystal film comprises a $Ga_2O_3$ crystal film.

According to another embodiment of the invention, a crystal multilayer structure as defined in [4] or [5] below is provided.

[4] A crystal multilayer structure, comprising:
a $Ga_2O_3$-based substrate with a (001)-oriented principal surface; and
a $Ga_2O_3$-based crystal film formed on the principal surface of the $Ga_2O_3$-based substrate by epitaxial growth,
wherein the principal surface has a flatness of not more than 1 nm in an RMS value.

[5] The crystal multilayer structure according to [4], wherein the $Ga_2O_3$-based crystal film comprises a $Ga_2O_3$ crystal film.

Effects of the Invention

According to one embodiment of the invention, a method of forming a $Ga_2O_3$-based crystal film can be provided that allows a $Ga_2O_3$-based crystal film with an excellent crystal quality and surface flatness to be formed at a high growth rate suitable for the mass productivity, as well as a crystal multilayer structure including the $Ga_2O_3$-based crystal film formed by the method.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

First Embodiment

Figure 1:
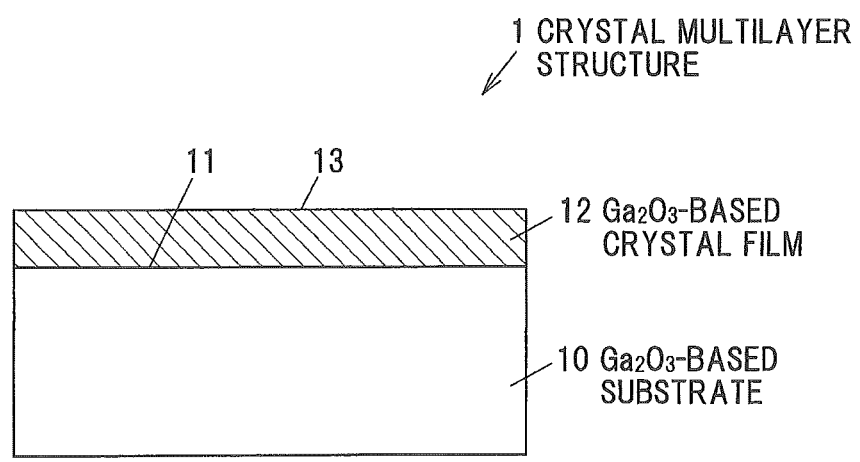
FIG. 1 is a vertical cross-sectional view showing a crystal multilayer structure in a first embodiment.

FIG. 1 is a vertical cross-sectional view showing a crystal multilayer structure in the first embodiment. A crystal multilayer structure 1 has a $Ga_2O_3$-based substrate 10 and a $Ga_2O_3$-based crystal film 12 formed on the $Ga_2O_3$-based substrate 10 by epitaxial crystal growth.

The $Ga_2O_3$-based substrate 10 is a substrate formed of a $Ga_2O_3$-based single crystal. The $Ga_2O_3$-based single crystal here is referred to a $Ga_2O_3$ single crystal or a $Ga_2O_3$ single crystal doped with an element such as Al and In, and may be, e.g., a $(Ga_xAl_yIn_{(1-x-y)})_2O_3$ ($0<x\leq1$, $0\leq y<1$, $0<x+y\leq1$) single crystal which is a $Ga_2O_3$ single crystal doped with Al and In.

The band gap is widened by adding Al and is narrowed by adding In. The $Ga_2O_3$ single crystal mentioned above has, e.g., a β-crystal structure. The $Ga_2O_3$-based substrate 10 may contain a conductive impurity such as Si.

The orientation of a principal surface 11 of the $Ga_2O_3$-based substrate 10 is (001).

For forming the $Ga_2O_3$-based substrate 10, for example, a bulk crystal of a $Ga_2O_3$-based single crystal is grown by melt-growth method such as FZ (Floating Zone) method or EFG (Edge Defined Film Fed Growth) method, is sliced and is then surface-polished.

The $Ga_2O_3$-based crystal film 12 is formed of a $Ga_2O_3$-based single crystal, similarly to the $Ga_2O_3$-based substrate 10. Since the $Ga_2O_3$-based crystal film 12 is formed on the principal surface 11 of the $Ga_2O_3$-based substrate 10 by epitaxial crystal growth, the orientation of a principal surface 13 of the $Ga_2O_3$-based crystal film 12 is also (001) in the same manner as the principal surface 11 of the $Ga_2O_3$-based substrate 10. The $Ga_2O_3$-based crystal film 12 may contain a conductive impurity such as Si.

The $Ga_2O_3$-based crystal film 12 is formed by, e.g., physical vapor deposition such as MBE (Molecular Beam Epitaxy) method or chemical vapor deposition such as CVD (Chemical Vapor Deposition) method.

The $Ga_2O_3$-based crystal film 12 is formed by epitaxial growth at a growth temperature of not less than 750° C. Flatness of the principal surface 13 of the $Ga_2O_3$-based crystal film 12 is improved by growing at a growth temperature of not less than 750° C. In detail, the RMS value of the principal surface 13 is not more than 1 nm.

Here, the RMS value is a numerical value to be an index of flatness, and is obtained by measuring a curve representing a relation between vertical height and horizontal position of the principal surface of the $Ga_2O_3$ crystal film using an atomic force microscope and then calculating the square root of the means of the squares of the deviation from the average line to the curve.

When manufacturing, e.g., Schottky diode or MESFET (Metal-Semiconductor Field Effect Transistor) using the crystal multilayer structure 1 with a large RMS value, there is a possibility that electric field concentration occurs at a Schottky electrode formed on the $Ga_2O_3$-based crystal film 12 and causes a decrease in element withstand voltage. This is caused because an electric field is concentrated at raised portions of irregularities on a bottom surface of the Schottky electrode which is formed due to irregularities on the principal surface 13 of the $Ga_2O_3$-based crystal film 12. That the RMS value is not more than 1 nm is known as a surface roughness condition for the bottom surface of the Schottky electrode to suppress the electric field concentration. In other words, it is possible to suppress the electric field concentration at the Schottky electrode when the RMS value of the principal surface 13 of the $Ga_2O_3$-based crystal film 12 is not more than 1 nm.

In addition, the $Ga_2O_3$-based crystal film 12 with high crystal quality is obtained by growing at a growth temperature of not less than 750° C. If growth temperature is more than 900° C., re-evaporation of the supplied Ga drastically proceeds and the growth rate drops to 1/10 or less of the growth rate at a growth temperature of 600° C. As such, lower growth temperature is preferable from the viewpoint of efficiency of raw material consumption. Therefore, growth temperature of the $Ga_2O_3$-based crystal film 12 is preferably not more than 900° C.

Since the $Ga_2O_3$-based crystal film 12 is excellent in crystal quality and flatness of principal surface, it is possible to form high-quality metal-semiconductor interface and insulating film-semiconductor interface on the $Ga_2O_3$-based crystal film 12. Therefore, it is possible to manufacture high-quality semiconductor devices by using the crystal multilayer structure 1.

Evaluation of $Ga_2O_3$-Based Crystal Film

Results of evaluating flatness of principal surface, a growth rate and crystal quality of the $Ga_2O_3$-based crystal film are described below. For the evaluation, a $Ga_2O_3$ substrate was used as the $Ga_2O_3$-based substrate and a $Ga_2O_3$ crystal film having a thickness of about 100 to 300 nm was formed as the $Ga_2O_3$-based crystal film by the MBE method. Ozone was used as an oxygen source for the $Ga_2O_3$ crystal film.

Figure 2A:
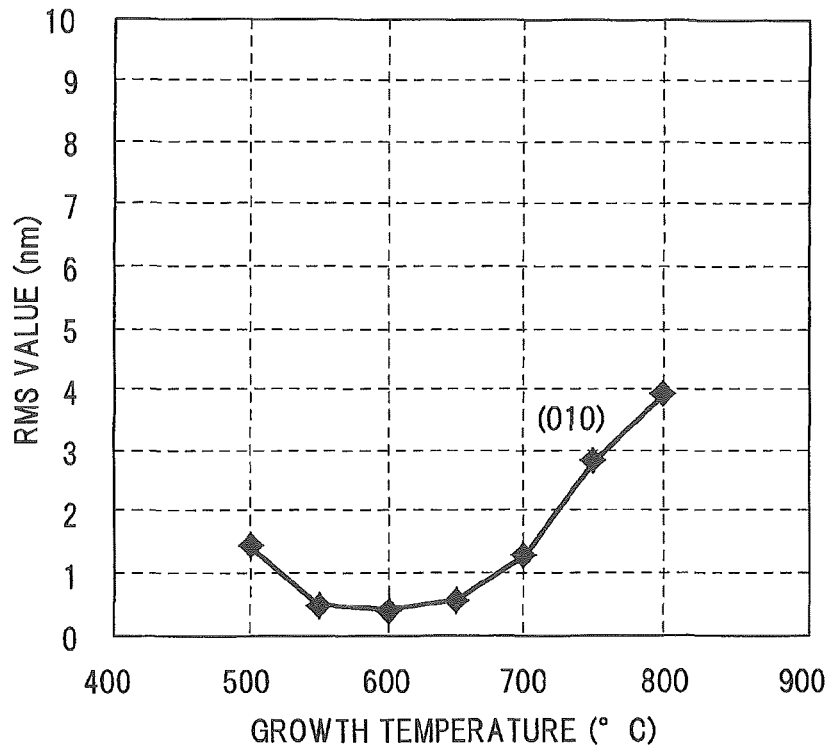
FIGS. 2A and 2B are graphs showing a relation between a growth temperature and flatness of a principal surface of a $Ga_2O_3$ crystal film when epitaxially grown on a (010)-oriented principal surface of a $Ga_2O_3$ substrate and a (−201)-oriented principal surface of a $Ga_2O_3$ substrate.
Figure 2B:
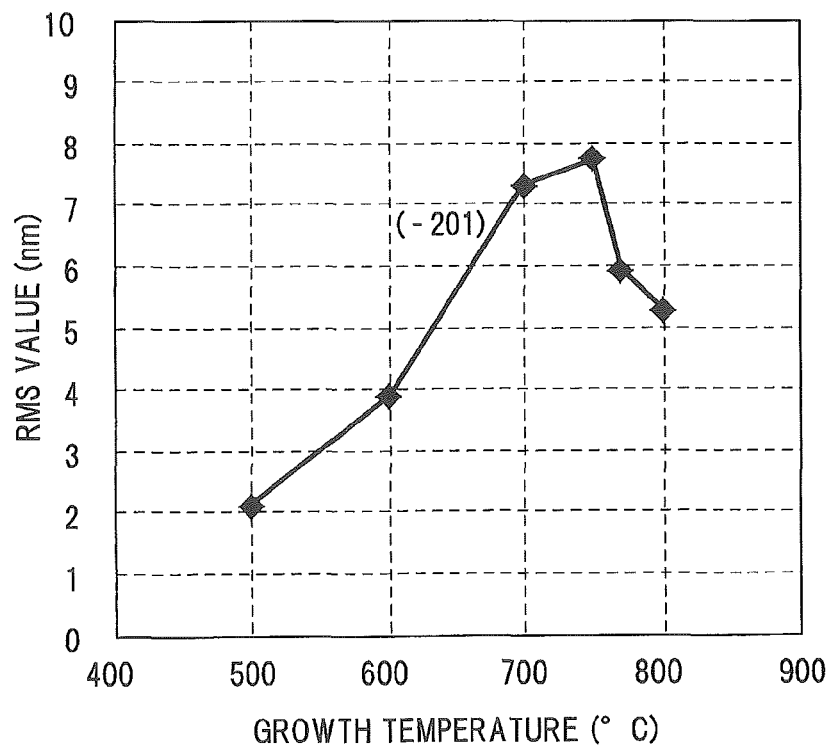

FIGS. 2A and 2B are graphs showing a relation between a growth temperature and flatness of a principal surface of a $Ga_2O_3$ crystal film when epitaxially grown on a (010)-oriented principal surface of a $Ga_2O_3$ substrate and a (−201)-oriented principal surface of a $Ga_2O_3$ substrate.

Figure 3A:
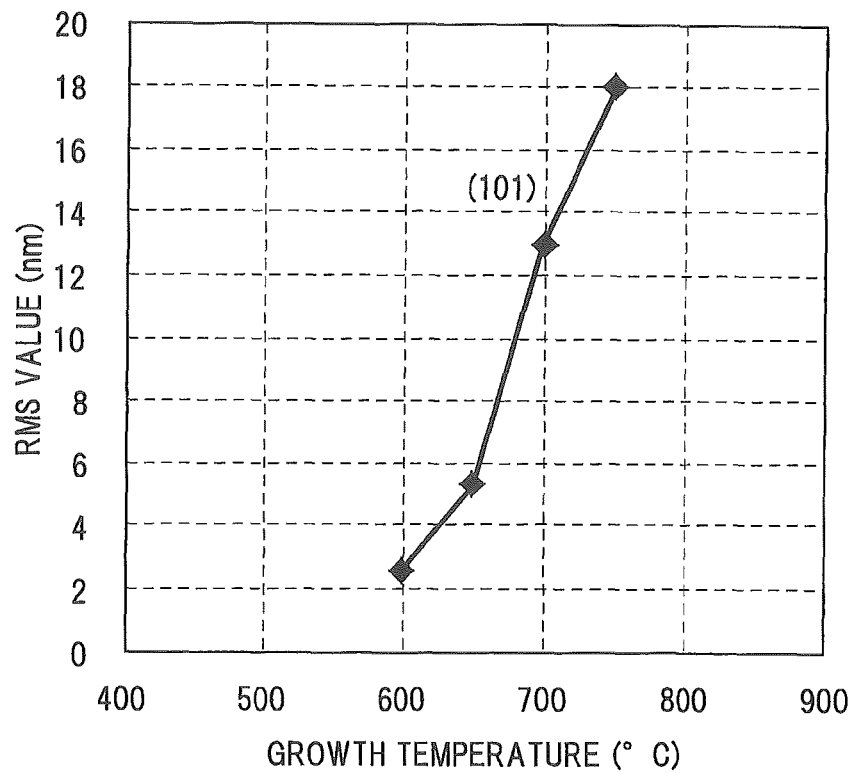
FIGS. 3A and 3B are graphs showing a relation between a growth temperature and flatness of a principal surface of a $Ga_2O_3$ crystal film when epitaxially grown on a (101)-oriented principal surface of a $Ga_2O_3$ substrate and a (001)-oriented principal surface of a $Ga_2O_3$ substrate.
Figure 3B:
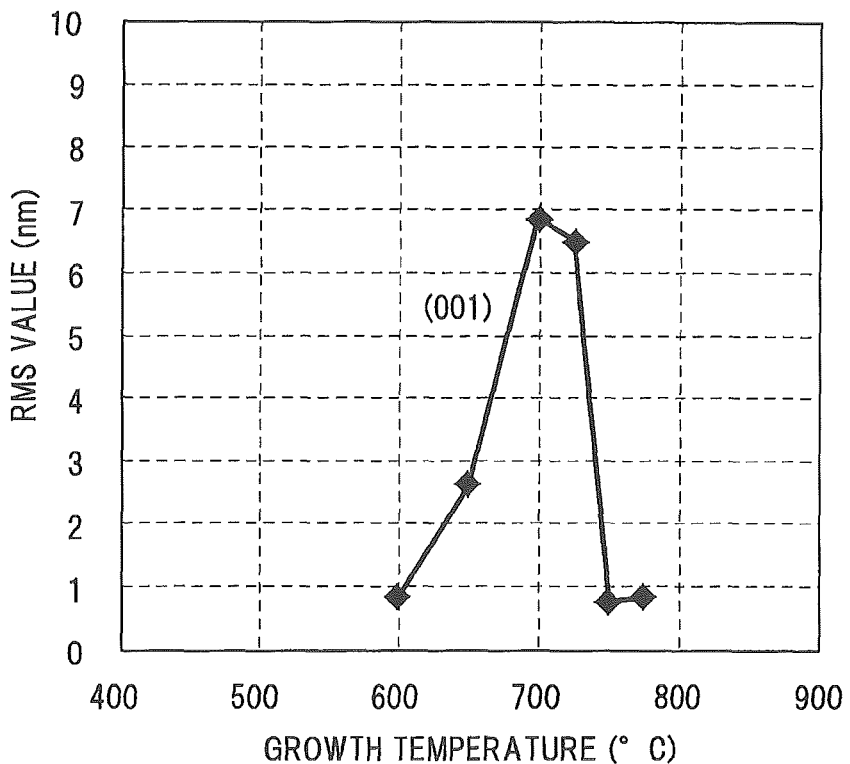

FIGS. 3A and 3B are graphs showing a relation between a growth temperature and flatness of a principal surface of a $Ga_2O_3$ crystal film when epitaxially grown on a (101)-oriented principal surface of a $Ga_2O_3$ substrate and a (001)-oriented principal surface of a $Ga_2O_3$ substrate.

In FIGS. 2A, 2B, 3A and 3B, the horizontal axis indicates growth temperature (° C.) of a $Ga_2O_3$ crystal film and the vertical axis indicates an RMS value (nm) of the principal surface of the $Ga_2O_3$ crystal film. The RMS value was calculated on an atomic force microscope image within an area of 1 μm square.

FIGS. 2B and 3A show that, when the orientation of the principal surface of the $Ga_2O_3$ substrate is (−201) or (101), a $Ga_2O_3$ crystal film excellent in flatness (e.g., the principal surface with the RMS value of not more than 1 nm) is not obtained regardless of growth temperature. A $Ga_2O_3$ crystal film with low flatness could be polished to improve flatness but this increases the number of processes and causes a resulting increase in the manufacturing cost, hence, it is not preferable.

Meanwhile, FIG. 2A shows that, when the orientation of the principal surface of the $Ga_2O_3$ substrate is (010), a $Ga_2O_3$ crystal film having the principal surface with the RMS value of not more than 1 nm is obtained at a growth temperature of about 550 to 650° C. However, it is not possible to obtain a $Ga_2O_3$ crystal film with high crystal quality at a growth temperature of about 550 to 650° C. In detail, for example, an etch pit density of the $Ga_2O_3$ crystal film is about $10^6$ $cm^{−2}$ when forming at a growth temperature of 600° C. but decreases to about $10^4$ $cm^{−2}$ when forming at a growth temperature of 700° C. (i.e., defects decrease to 1/100). A $Ga_2O_3$ crystal film with quality equivalent to the $Ga_2O_3$ substrate, of which the etch pit density is about $10^4$ $cm^{−2}$, is obtained by setting the growth temperature to not less than 700° C.

However, as seen in FIG. 2A, it is not possible to obtain a $Ga_2O_3$ crystal film having a principal surface with the RMS value of not more than 1 nm at not less than 700° C. This shows that it is difficult to obtain a $Ga_2O_3$ crystal film excellent in both crystal quality and flatness of principal surface when the orientation of the principal surface of the $Ga_2O_3$ substrate is (010).

Meanwhile, FIG. 3B shows that, when the orientation of the principal surface of the $Ga_2O_3$ substrate is (001), a $Ga_2O_3$ crystal film having the principal surface with the RMS value of not more than 1 nm is obtained at a growth temperature of not less than 750° C.

Similar evaluation results to the above are obtained both when another $Ga_2O_3$-based substrate is used in place of the $Ga_2O_3$ substrate and when another $Ga_2O_3$-based crystal film is formed instead of forming the $Ga_2O_3$ crystal film. In other words, when the orientation of the principal surface of the Ga$_2$O$_3$-based substrate is (001), a Ga$_2$O$_3$-based crystal film having the principal surface with the RMS value of not more than 1 nm is obtained by growing at a growth temperature of not less than 750° C.

Figure 4:
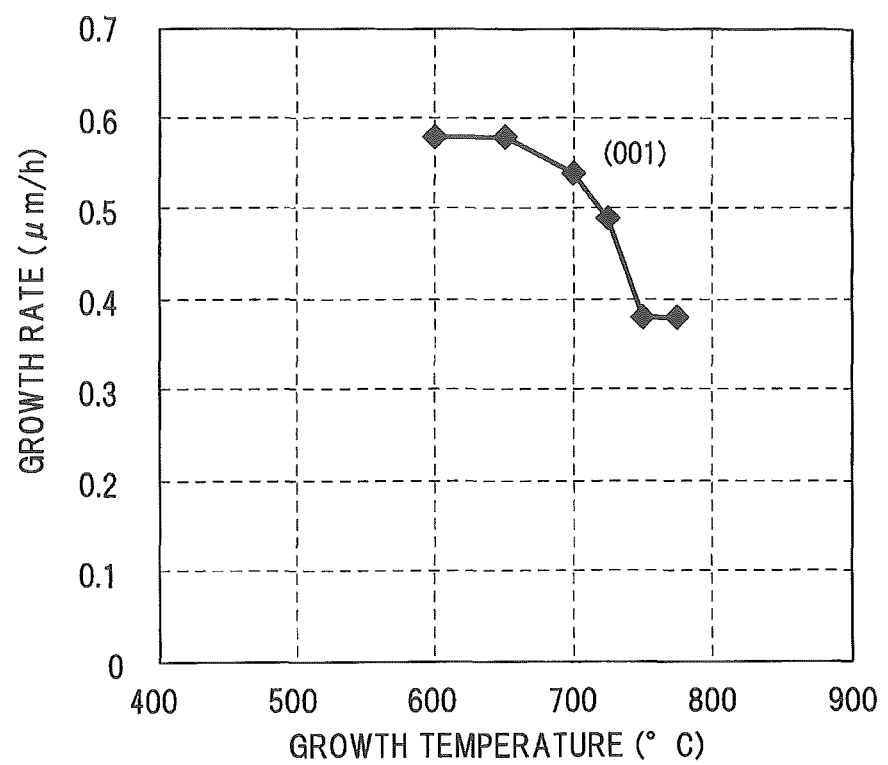
FIG. 4 is a graph showing a relation between growth temperature and growth rate of the $Ga_2O_3$ crystal film when epitaxially grown on the (001)-oriented principal surface of the $Ga_2O_3$ substrate.

FIG. 4 is a graph showing a relation between growth temperature and growth rate of the Ga$_2$O$_3$ crystal film when epitaxially grown on the (001)-oriented principal surface of the Ga$_2$O$_3$ substrate.

In FIG. 4, the horizontal axis indicates growth temperature (° C.) of the Ga$_2$O$_3$ crystal film and the vertical axis indicates a growth rate (μm/h) of the Ga$_2$O$_3$ crystal film.

It is understood from FIG. 4 that a growth rate at a growth temperature of not less than 750° C., at which the Ga$_2$O$_3$ crystal film having the principal surface with the RMS value of not more than 1 nm is obtained, is lower than the growth rate at a relatively row growth temperature of 600 to 700° C. but is about 0.4 μm/h which does not cause any problem for mass production of the Ga$_2$O$_3$ crystal film.

Similar evaluation results to the above are obtained both when another Ga$_2$O$_3$-based substrate is used in place of the Ga$_2$O$_3$ substrate and when another Ga$_2$O$_3$-based crystal film is formed instead of forming the Ga$_2$O$_3$ crystal film. In other words, when the orientation of the principal surface of the Ga$_2$O$_3$-based substrate is (001), a growth rate of about 0.4 μm/h is obtained at a growth temperature of not less than 750° C.

Figure 5:
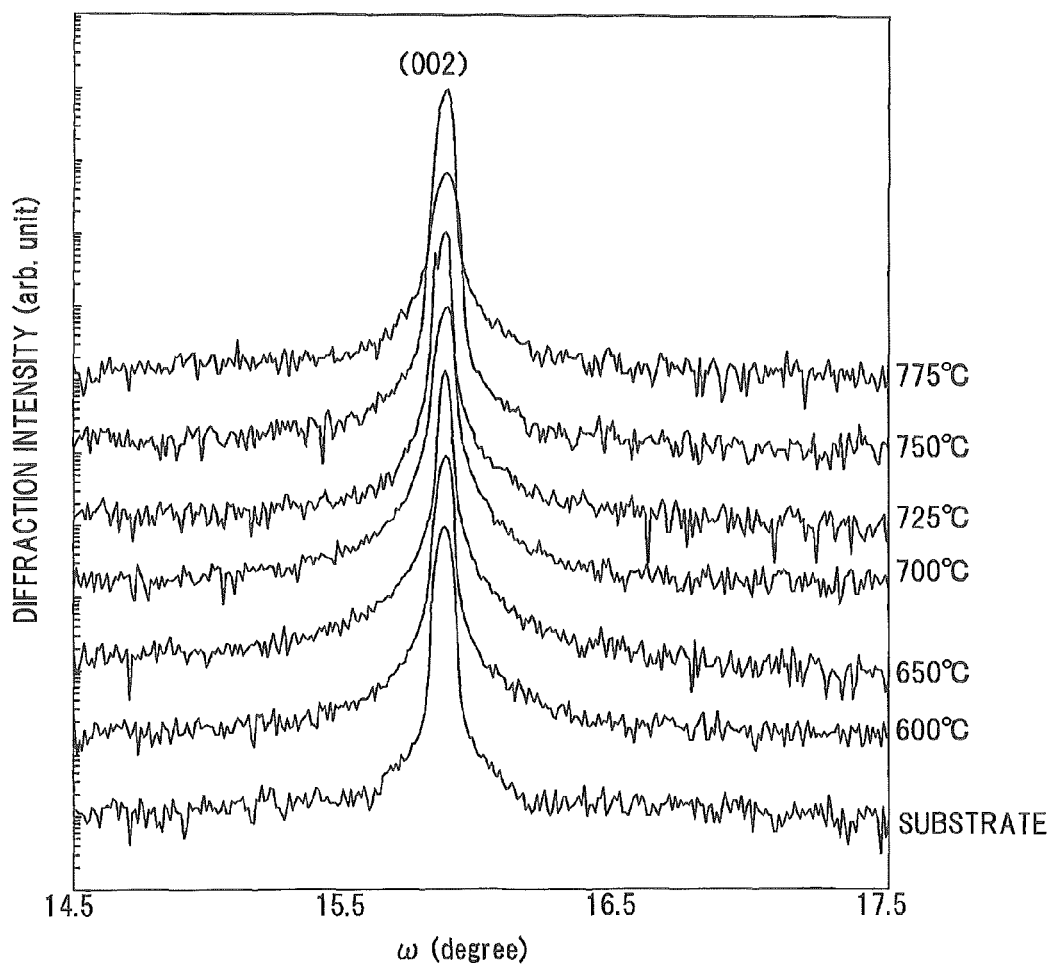
FIG. 5 is a graph showing X-ray diffraction spectra obtained by X-ray rocking curve measurement on crystal multilayer structures in which a $Ga_2O_3$ crystal film is epitaxially grown on the (001)-oriented principal surface of the $Ga_2O_3$ substrate.

FIG. 5 is a graph showing X-ray diffraction spectra obtained by X-ray rocking curve measurement on crystal multilayer structures in which a Ga$_2$O$_3$ crystal film is epitaxially grown on the (001)-oriented principal surface of the Ga$_2$O$_3$ substrate.

In FIG. 5, the horizontal axis indicates an incidence angle ω (degree) of an x-ray and the vertical axis indicates diffraction intensity (arbitrary unit) of the x-ray.

FIG. 5 shows a spectrum of the Ga$_2$O$_3$ substrate (without Ga$_2$O$_3$ crystal film) and spectra of crystal multilayer structures in which the Ga$_2$O$_3$ crystal film is epitaxially grown respectively at 600° C., 650° C., 700° C., 725° C., 750° C. and 775° C. In FIG. 5, a diffraction peak in each spectrum is a diffraction peak of (002) plane.

FIG. 5 shows that the diffraction peak of the any of the crystal multilayer structures has substantially the same half width as the diffraction peak of the Ga$_2$O$_3$ substrate. This shows that a Ga$_2$O$_3$ crystal film with small variation in a crystal orientation is obtained by growing at any growth temperature between 600 to 775° C.

Similar evaluation results to the above are obtained both when another Ga$_2$O$_3$-based substrate is used in place of the Ga$_2$O$_3$ substrate and when another Ga$_2$O$_3$-based crystal film is formed instead of forming the Ga$_2$O$_3$ crystal film. In other words, when the orientation of the principal surface of the Ga$_2$O$_3$-based substrate is (001), it is possible to obtain a Ga$_2$O$_3$-based crystal film with small variation in a crystal orientation by growing at any growth temperature between 600 to 775° C.

Figure 6:
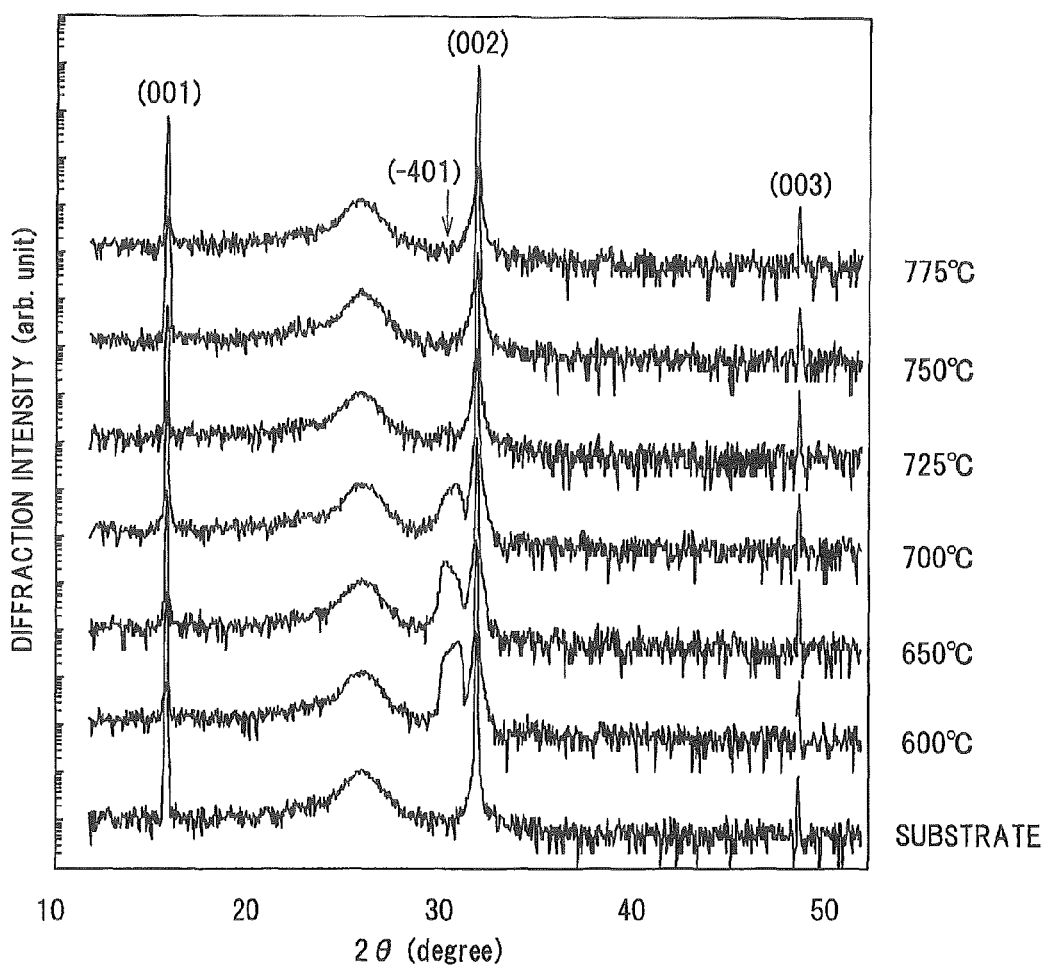
FIG. 6 is a graph showing X-ray diffraction spectra obtained by 2θ-ω scan on crystal multilayer structures in which a $Ga_2O_3$ crystal film is epitaxially grown on the (001)-oriented principal surface of the $Ga_2O_3$ substrate.

FIG. 6 is a graph showing X-ray diffraction spectra obtained by 2θ-ω scan on crystal multilayer structures in which a Ga$_2$O$_3$ crystal film is epitaxially grown on the (001)-oriented principal surface of the Ga$_2$O$_3$ substrate.

In FIG. 6, the horizontal axis indicates an angle 2θ (degree) formed between incidence and reflection directions of an x-ray and the vertical axis indicates diffraction intensity (arbitrary unit) of the x-ray.

FIG. 6 shows a spectrum of the Ga$_2$O$_3$ substrate (without Ga$_2$O$_3$ crystal film) and spectra of crystal multilayer structures in which the Ga$_2$O$_3$ crystal film is epitaxially grown respectively at 600° C., 650° C., 700° C., 725° C., 750° C. and 775° C.

FIG. 6 shows that a diffraction peak of (−401) plane, which occurs due to presence of heterogeneous phase and is observed in spectra of the crystal multilayer structures having a Ga$_2$O$_3$ crystal film grown at a growth temperature between 600 to 725° C., disappears in spectra of the crystal multilayer structures having a Ga$_2$O$_3$ crystal film grown at a growth temperature of not less than 750° C. This shows that a single-phase Ga$_2$O$_3$ crystal film is obtained by growing at a growth temperature of not less than 750° C. The broad peak around 2θ=26° occurs due to diffraction from a substrate holder of an X-ray diffractometer.

In addition, the etch pit density of the Ga$_2$O$_3$ crystal film formed at a growth temperature of 750° C. is about $10^4$ cm$^{-2}$ and is substantially equal to the etch pit density of the Ga$_2$O$_3$ substrate which is also about $10^4$ cm$^{-2}$. This shows that the Ga$_2$O$_3$ crystal film has high crystal quality equivalent to the Ga$_2$O$_3$ substrate.

Similar evaluation results to the above are obtained both when another Ga$_2$O$_3$-based substrate is used in place of the Ga$_2$O$_3$ substrate and when another Ga$_2$O$_3$-based crystal film is formed instead of forming the Ga$_2$O$_3$ crystal film. In other words, when the orientation of the principal surface of the Ga$_2$O$_3$-based substrate is (001), a single-phase Ga$_2$O$_3$-based crystal film is obtained by growing at a growth temperature of not less than 750° C.

Considering the evaluation results obtained from the X-ray diffraction spectra in FIG. 5 together with the evaluation results obtained from the X-ray diffraction spectra in FIG. 6, it is understood that a Ga$_2$O$_3$-based crystal film excellent in crystal quality is obtained by growing at a growth temperature of not less than 750° C.

Second Embodiment

A high-electron-mobility transistor (HEMT), which is one of semiconductor devices including the Ga$_2$O$_3$-based substrate 10 and the Ga$_2$O$_3$-based crystal film 12 of the first embodiment, will be described as the second embodiment.

Figure 7:
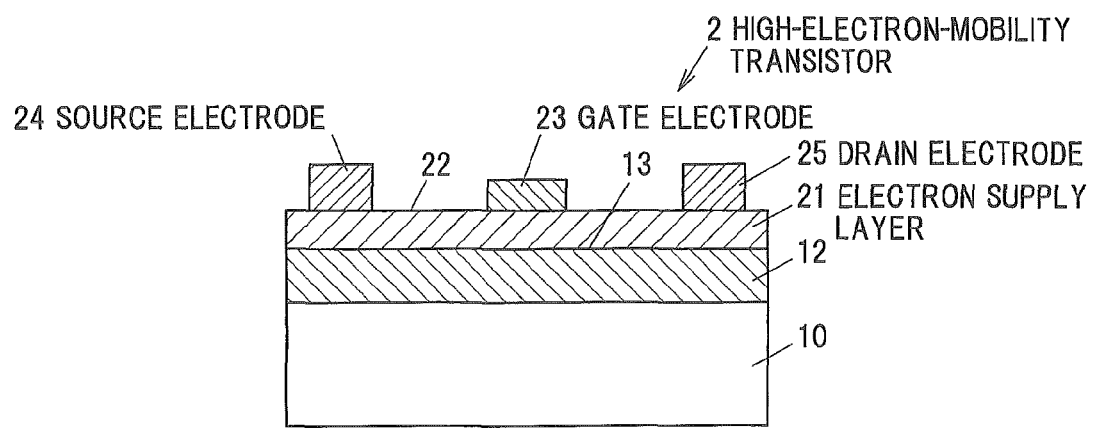
FIG. 7 is a vertical cross-sectional view showing a high-electron-mobility transistor in a second embodiment.

FIG. 7 is a vertical cross-sectional view showing a high-electron-mobility transistor in the second embodiment. A high-electron-mobility transistor 2 includes the Ga$_2$O$_3$-based substrate 10 and the Ga$_2$O$_3$-based crystal film 12 of the first embodiment. The high-electron-mobility transistor 2 further includes an electron supply layer 21 on the principal surface 13 of the Ga$_2$O$_3$-based crystal film 12, and a gate electrode 23, a source electrode 24 and a drain electrode 25 which are provided on the electron supply layer 21. The gate electrode 23 is arranged between the source electrode 24 and the drain electrode 25.

The gate electrode 23 is in contact with a principal surface 22 of the electron supply layer 21, thereby forming a Schottky junction. Meanwhile, the source electrode 24 and the drain electrode 25 are in contact with the principal surface 22 of the electron supply layer 21, thereby forming an ohmic junction.

In the second embodiment, the Ga$_2$O$_3$-based substrate 10 contains group II elements such as Mg and has high electrical resistance. Meanwhile, the Ga$_2$O$_3$-based crystal film 12 is of an i-type and functions as an electron transit layer.

The electron supply layer 21 is formed of, e.g., a β-(AlGa)$_2$O$_3$ single crystal doped with a donor such as Si or Sn and is formed by epitaxial growth on the Ga$_2$O$_3$-based crystal film 12.

Since the Ga$_2$O$_3$-based crystal film 12 and the electron supply layer 21 have different band gaps, discontinuity of bands occurs at the interface therebetween, electrons generated from the donor in the electron supply layer 21 are concentrated on the $Ga_2O_3$-based crystal film 12 side and are distributed in a region in the vicinity of the interface, and an electron layer called two-dimensional electron gas is thereby formed.

As such, a first depletion layer due to the Schottky junction with the gate electrode 23 and a second depletion layer due to the formation of two-dimensional electron gas are produced in the electron supply layer 21. The electron supply layer 21 has such a thickness that the first depletion layer is in contact with the second depletion layer.

Voltage is applied to the gate electrode 23 to change the thicknesses of the first and second depletion layers and to adjust the concentration of the two-dimensional electron gas, thereby controlling a drain current.

The thickness of the $Ga_2O_3$-based crystal film 12 is not specifically limited but is preferably not less than 1 nm. In addition, the thickness of the electron supply layer 21 is set between 0.001 and 1 µm depending on a doping concentration.

In the high-electron-mobility transistor 2, since flatness of the principal surface 13 of the $Ga_2O_3$-based crystal film 12 is high, flatness of the principal surface 22 of the electron supply layer 21 formed on the $Ga_2O_3$-based crystal film 12 is also high and electric field concentration at the gate electrode 23 forming, together with electron supply layer 21, a Schottky junction is suppressed. Therefore, a decrease in withstand voltage performance of the high-electron-mobility transistor 2 is suppressed.

Third Embodiment

A MESFET (Metal-Semiconductor Field Effect Transistor), which is one of semiconductor devices including the $Ga_2O_3$-based substrate 10 and the $Ga_2O_3$-based crystal film 12 of the first embodiment, will be described as the third embodiment.

Figure 8:
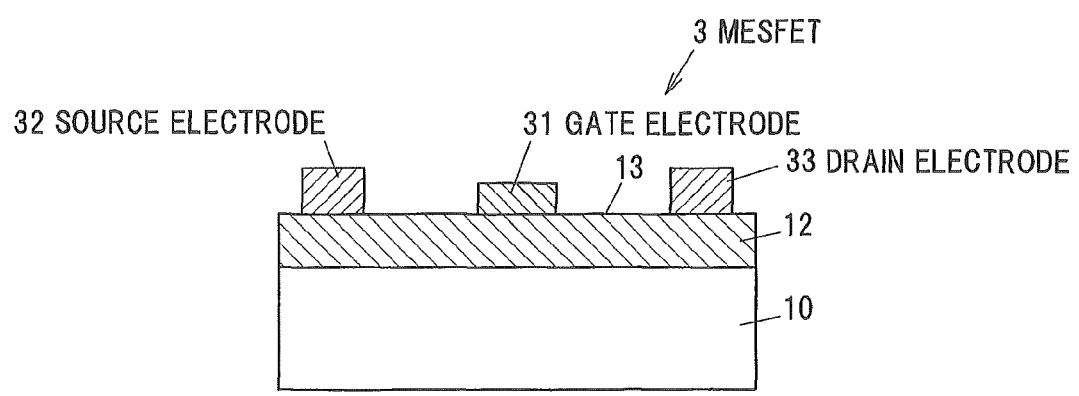
FIG. 8 is a vertical cross-sectional view showing a MESFET in a third embodiment.

FIG. 8 is a vertical cross-sectional view showing a MESFET in the third embodiment. A MESFET 3 includes the $Ga_2O_3$-based substrate 10 and the $Ga_2O_3$-based crystal film 12 of the first embodiment. The MESFET 3 further includes a gate electrode 31, a source electrode 32 and a drain electrode 33 which are provided on the $Ga_2O_3$-based crystal film 12. The gate electrode 31 is arranged between the source electrode 32 and the drain electrode 33.

The gate electrode 31 is in contact with the principal surface 13 of the $Ga_2O_3$-based crystal film 12, thereby forming a Schottky junction. Meanwhile, the source electrode 32 and the drain electrode 33 are in contact with the principal surface 13 of the $Ga_2O_3$-based crystal film 12, thereby forming an ohmic junction.

In the third embodiment, the $Ga_2O_3$-based substrate 10 contains group II elements such as Mg and has high electrical resistance.

In the third embodiment, the $Ga_2O_3$-based crystal film 12 is of an n-type and the donor concentration thereof in the vicinity of contact areas with the source electrode 32 and with the drain electrode 33 is higher than that in the remaining portion.

The thickness of the depletion layer in the $Ga_2O_3$-based crystal film 12 under the gate electrode 31 is changed by controlling bias voltage applied to the gate electrode 31, thereby allowing a drain current to be controlled.

In the MESFET 3, since flatness of the principal surface 13 of the $Ga_2O_3$-based crystal film 12 is high, electric field concentration at the gate electrode 31 forming, together with the $Ga_2O_3$-based crystal film 12, a Schottky junction is suppressed. Therefore, a decrease in withstand voltage performance of the MESFET 3 is suppressed.

Fourth Embodiment

A Schottky-barrier diode, which is one of semiconductor devices including the $Ga_2O_3$-based substrate 10 and the $Ga_2O_3$-based crystal film 12 of the first embodiment, will be described as the fourth embodiment.

Figure 9:
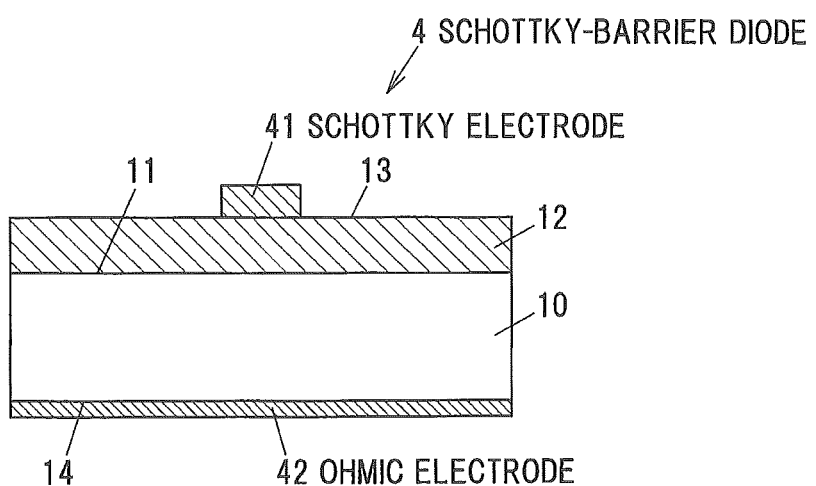
FIG. 9 is a vertical cross-sectional view showing a Schottky-barrier diode in a fourth embodiment.

FIG. 9 is a vertical cross-sectional view showing a Schottky-barrier diode in the fourth embodiment. A Schottky-barrier diode 4 includes the $Ga_2O_3$-based substrate 10 and the $Ga_2O_3$-based crystal film 12 of the first embodiment. The Schottky-barrier diode 4 further includes a Schottky electrode 41 on the principal surface 13 of the $Ga_2O_3$-based crystal film 12 and an ohmic electrode 42 on a principal surface 14 of the $Ga_2O_3$-based substrate 10 opposite to the principal surface 11.

The Schottky electrode 41 is in contact with the principal surface 13 of the $Ga_2O_3$-based crystal film 12, thereby forming a Schottky junction. Meanwhile, the ohmic electrode 42 is in contact with the principal surface 14 of the $Ga_2O_3$-based substrate 10, thereby forming an ohmic junction.

In the fourth embodiment, the $Ga_2O_3$-based substrate 10 and the $Ga_2O_3$-based crystal film 12 are of an n-type and the donor concentration of the $Ga_2O_3$-based crystal film 12 is lower than that of the $Ga_2O_3$-based substrate 10.

When forward voltage (electric potential is positive on the Schottky electrode 41 side) is applied to the Schottky-barrier diode 4, the number of electrons moving from the $Ga_2O_3$-based substrate 10 to the $Ga_2O_3$-based crystal film 12 is increased. As a result, a forward current flows from the Schottky electrode 41 to the ohmic electrode 42.

On the other hand, when reverse voltage (electric potential is negative on the Schottky electrode 41 side) is applied to the Schottky-barrier diode 4, substantially no electric current flows through the Schottky-barrier diode 4.

In the Schottky-barrier diode 4, since flatness of the principal surface 13 of the $Ga_2O_3$-based crystal film 12 is high, electric field concentration at the Schottky electrode 41 forming, together with the $Ga_2O_3$-based crystal film 12, a Schottky junction is suppressed. Therefore, a decrease in withstand voltage performance of the Schottky-barrier diode 4 is suppressed.

Fifth Embodiment

A MOSFET (Metal-oxide-Semiconductor Field Effect Transistor), which is one of semiconductor devices including the $Ga_2O_3$-based substrate 10 and the $Ga_2O_3$-based crystal film 12 of the first embodiment, will be described as the fifth embodiment.

Figure 10:
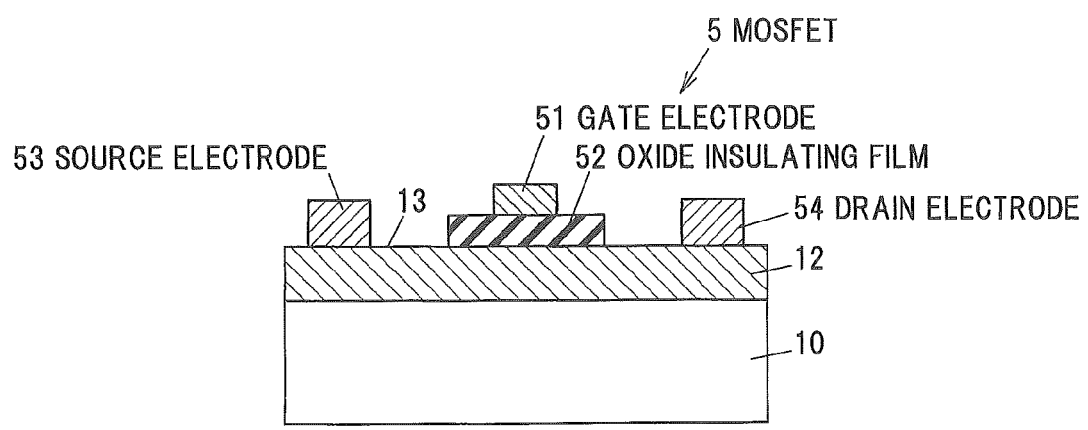
FIG. 10 is a vertical cross-sectional view showing a MOSFET in a fifth embodiment.

FIG. 10 is a vertical cross-sectional view showing a MOSFET in the fifth embodiment. A MOSFET 5 includes the $Ga_2O_3$-based substrate 10 and the $Ga_2O_3$-based crystal film 12 of the first embodiment. The MOSFET 5 further includes an oxide insulating film 52, a gate electrode 51, a source electrode 53 and a drain electrode 54 which are provided on the $Ga_2O_3$-based crystal film 12. The insulating film 52 and the gate electrode 51 are arranged between the source electrode 53 and the drain electrode 54.

The gate electrode 51 is formed on the principal surface 13 of the $Ga_2O_3$-based crystal film 12 via the insulating film 52. Meanwhile, the source electrode 53 and the drain electrode 54 are in contact with the principal surface 13 of the $Ga_2O_3$-based crystal film 12, thereby forming an ohmic junction.

In the fifth embodiment, the $Ga_2O_3$-based substrate 10 contains group II elements such as Mg and has high electrical resistance.

It is possible to control a drain current flowing through the $Ga_2O_3$-based crystal film 12 by controlling bias voltage applied to the gate electrode 51.

In the MOSFET 5, since flatness of the principal surface 13 of the $Ga_2O_3$-based crystal film 12 is high, it is possible to provide a steep interface between the $Ga_2O_3$-based crystal film 12 and the oxide insulating film 52 and thereby to suppress electric field concentration or a decrease in channel mobility, etc.

Effects of the Embodiments

According to the embodiments, it is possible to form a $Ga_2O_3$-based crystal film with excellent crystal quality and principal surface flatness at a growth rate high enough for mass production. In addition, since the $Ga_2O_3$-based crystal film is excellent in crystal quality and flatness of principal surface, it is possible to grow a good-quality crystal film on the $Ga_2O_3$-based crystal film. Thus, use of the crystal multilayer structure including the $Ga_2O_3$-based crystal film in the embodiment allows high-quality semiconductor devices to be manufactured.

Although the embodiments of the invention have been described, the invention is not intended to be limited to these embodiments, and the various kinds of modifications can be implemented without departing from the gist of the invention.

In addition, the invention according to claims is not to be limited to the embodiments. Further, it should be noted that all combinations of the features described in the embodiments are not necessary to solve the problem of the invention.

What is claimed is:

1. A method of forming a $Ga_2O_3$-based crystal film, comprising epitaxially growing a $Ga_2O_3$-based crystal film on a (001)-oriented principal surface of a $Ga_2O_3$-based substrate at a growth temperature of not less than 750° C.
   wherein the principal surface of the $Ga_2O_3$-based crystal film has a flatness of not more than 1 nm in an RMS value.

2. The method according to claim 1, wherein the $Ga_2O_3$-based crystal film comprises a $Ga_2O_3$ crystal film.

3. A crystal multilayer structure, comprising;
   a $Ga_2O_3$-based substrate with a (001)-oriented principal surface; and
   a $Ga_2O_3$-based crystal film formed on the principal surface of the $Ga_2O_3$-based substrate by epitaxial growth,
   wherein the principal surface has a flatness of not more than 1 nm in an RMS value.

4. The crystal multilayer structure according to claim 3, wherein the $Ga_2O_3$-based crystal film comprises a $Ga_2O_3$ crystal film.

* * * * *